(12) United States Patent
Camarota

(10) Patent No.: US 9,026,872 B2
(45) Date of Patent: May 5, 2015

(54) FLEXIBLE SIZED DIE FOR USE IN MULTI-DIE INTEGRATED CIRCUIT

(75) Inventor: Rafael C. Camarota, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 355 days.

(21) Appl. No.: 13/587,778

(22) Filed: Aug. 16, 2012

(65) Prior Publication Data

US 2014/0049932 A1 Feb. 20, 2014

(51) Int. Cl.
*G01R 31/28* (2006.01)
*H01L 21/66* (2006.01)
(Continued)

(52) U.S. Cl.
CPC ............... *G01R 31/28* (2013.01); *H01L 21/78* (2013.01); *H01L 22/32* (2013.01); *H01L 23/147* (2013.01); *H01L 25/0652* (2013.01); *H01L 25/0655* (2013.01); *H01L 2224/13116* (2013.01); *H01L 2224/13139* (2013.01); *H01L 2224/13147* (2013.01); *H01L 2224/16145* (2013.01); *H01L 2224/16225* (2013.01); *H01L 2224/32225* (2013.01); *H01L 2224/48227* (2013.01); *H01L 2225/06517* (2013.01); *H01L 2924/14* (2013.01); *H01L 2924/1432* (2013.01); *H01L 2924/1433* (2013.01); *H01L 2924/1434* (2013.01);
(Continued)

(58) Field of Classification Search
CPC ............. H01L 2924/0105; H01L 2224/13116; H01L 2224/13139; H01L 2224/13147; H01L 21/78; H01L 2224/16145; H01L 2224/16225; H01L 2224/32225; H01L 2224/48227; H01L 2225/06513; H01L 2225/06517; H01L 2225/06541; H01L 22/32; H01L 23/145; H01L 23/147; H01L 23/49827; H01L 25/0652; H01L 25/0655; H01L 2924/14; H01L 2924/14253; H01L 2924/1432; H01L 2924/1433; H01L 2924/1434; H01L 2924/1435; H01L 2924/15192; H01L 2924/15311; H01L 2924/157; H01L 2924/15788; G01R 31/28; G01R 31/318536; G01R 31/3177
USPC ......... 714/724, 725, 726, 727, 729, 733, 734; 324/762.01, 762.02, 762.03, 762.06; 257/723, 725, 621, 686, 774, 778
See application file for complete search history.

(56) References Cited

U.S. PATENT DOCUMENTS 4,467,342 A 8/1984 Tower
4,803,595 A 2/1989 Kraus et al.
(Continued)

FOREIGN PATENT DOCUMENTS

EP 2151717 A1 2/2010

OTHER PUBLICATIONS

Specification and drawings for U.S. Appl. No. 14/321,591, filed Jul. 1, 2014, Hisamura.
(Continued)

*Primary Examiner* — John J Tabone, Jr.
(74) *Attorney, Agent, or Firm* — Kevin T. Cuenot; Keith Taboada; Lois D. Cartier

(57) ABSTRACT

An integrated circuit (IC) structure can include a first die and a second die. The second die can include a first base unit and a second base unit. Each of the first base unit and the second base unit is self-contained and no signals pass between the first base unit and the second base unit within the second die. The IC structure can include an interposer. The interposer includes a first plurality of inter-die wires coupling the first die to the first base unit, a second plurality of inter-die wires coupling the first die to the second base unit, and a third plurality of inter-die wires coupling the first base unit to the second base unit.

20 Claims, 9 Drawing Sheets

(51) Int. Cl.
*H01L 23/14* (2006.01)
*H01L 25/065* (2006.01)
*H01L 23/498* (2006.01)
*H01L 21/78* (2006.01)

(52) U.S. Cl.
CPC ............. *H01L2924/1435* (2013.01); *H01L 2924/15192* (2013.01); *H01L 2924/15311* (2013.01); *H01L 2924/157* (2013.01); *H01L 2924/15788* (2013.01); *H01L 2225/06513* (2013.01); *H01L 2225/06541* (2013.01); *H01L 2924/14253* (2013.01); *H01L 23/145* (2013.01); *H01L 23/49827* (2013.01)

(56) References Cited

U.S. PATENT DOCUMENTS

| | | |
|---|---|---|
| 5,285,236 A | 2/1994 | Jain |
| 5,399,898 A | 3/1995 | Rostoker |
| 5,437,946 A | 8/1995 | McCoy |
| 5,489,804 A | 2/1996 | Pasch |
| 5,673,276 A * | 9/1997 | Jarwala et al. ............... 714/727 |
| 5,687,179 A * | 11/1997 | Whetsel et al. ............... 714/726 |
| 5,715,144 A | 2/1998 | Ameen et al. |
| 5,787,007 A | 7/1998 | Bauer |
| 5,814,847 A | 9/1998 | Shihadeh et al. |
| 5,869,894 A | 2/1999 | Degani et al. |
| 5,897,986 A | 4/1999 | Dunn et al. |
| 5,907,903 A | 6/1999 | Ameen et al. |
| 6,043,672 A | 3/2000 | Sugasawara |
| 6,085,344 A * | 7/2000 | Whetsel et al. ............... 714/726 |
| 6,157,213 A | 12/2000 | Voogel |
| 6,158,035 A * | 12/2000 | Whetsel et al. ............... 714/731 |
| 6,160,418 A | 12/2000 | Burnham |
| 6,204,689 B1 | 3/2001 | Percey et al. |
| 6,215,327 B1 | 4/2001 | Lyle |
| 6,216,257 B1 | 4/2001 | Agrawal et al. |
| 6,218,864 B1 | 4/2001 | Young et al. |
| 6,239,366 B1 | 5/2001 | Hsuan et al. |
| 6,288,772 B1 | 9/2001 | Shinozaki et al. |
| 6,359,466 B1 | 3/2002 | Sharpe-Geisler |
| 6,369,444 B1 | 4/2002 | Degani et al. |
| 6,396,303 B1 | 5/2002 | Young |
| 6,407,456 B1 | 6/2002 | Ball |
| 6,410,983 B1 | 6/2002 | Moriizumi et al. |
| 6,429,509 B1 | 8/2002 | Hsuan |
| 6,448,808 B2 | 9/2002 | Young et al. |
| 6,500,696 B2 | 12/2002 | Sutherland |
| 6,512,573 B2 | 1/2003 | Fürter |
| 6,525,407 B1 | 2/2003 | Drewery |
| 6,559,531 B1 | 5/2003 | Sutherland |
| 6,583,854 B1 | 6/2003 | Hazama et al. |
| 6,611,635 B1 | 8/2003 | Yoshimura et al. |
| 6,675,333 B1 * | 1/2004 | Whetsel et al. ............... 714/726 |
| 6,731,009 B1 | 5/2004 | Jones et al. |
| 6,734,553 B2 | 5/2004 | Kimura |
| 6,870,271 B2 | 3/2005 | Sutherland et al. |
| 6,930,378 B1 | 8/2005 | St. Amand et al. |
| 6,944,809 B2 | 9/2005 | Lai et al. |
| 6,972,487 B2 | 12/2005 | Kato et al. |
| 6,984,889 B2 | 1/2006 | Kimura |
| 6,988,230 B2 * | 1/2006 | Vermeulen et al. ........... 714/727 |
| 6,992,395 B2 | 1/2006 | Fukasawa |
| 7,002,828 B2 | 2/2006 | Santin et al. |
| 7,028,281 B1 | 4/2006 | Agrawal et al. |
| 7,030,466 B1 | 4/2006 | Hsuan |
| 7,069,485 B2 * | 6/2006 | Whetsel et al. ............... 714/726 |
| 7,071,568 B1 | 7/2006 | St. Amand et al. |
| 7,087,989 B2 | 8/2006 | Nakayama |
| 7,088,134 B1 | 8/2006 | Agrawal et al. |
| 7,095,253 B1 | 8/2006 | Young |
| 7,098,542 B1 | 8/2006 | Hoang et al. |
| 7,107,565 B1 | 9/2006 | Lindholm et al. |
| 7,132,753 B1 | 11/2006 | St. Amand et al. |
| 7,181,718 B1 | 2/2007 | Bilski et al. |
| 7,187,200 B2 | 3/2007 | Young |
| 7,190,190 B1 | 3/2007 | Camarota et al. |
| 7,193,433 B1 | 3/2007 | Young |
| 7,196,543 B1 | 3/2007 | Young et al. |
| 7,199,610 B1 | 4/2007 | Young et al. |
| 7,202,697 B1 | 4/2007 | Kondapalli et al. |
| 7,202,698 B1 | 4/2007 | Bauer et al. |
| 7,205,790 B1 | 4/2007 | Young |
| 7,215,016 B2 | 5/2007 | Wang |
| 7,215,138 B1 | 5/2007 | Kondapalli et al. |
| 7,218,139 B1 | 5/2007 | Young et al. |
| 7,218,140 B1 | 5/2007 | Young |
| 7,218,143 B1 | 5/2007 | Young |
| 7,221,186 B1 | 5/2007 | Young |
| 7,230,329 B2 | 6/2007 | Sawamoto et al. |
| 7,233,168 B1 | 6/2007 | Simkins |
| 7,253,658 B1 | 8/2007 | Young |
| 7,256,612 B1 | 8/2007 | Young et al. |
| 7,265,576 B1 | 9/2007 | Kondapalli et al. |
| 7,268,587 B1 | 9/2007 | Pham et al. |
| 7,274,214 B1 | 9/2007 | Young |
| 7,276,934 B1 | 10/2007 | Young |
| 7,279,929 B1 | 10/2007 | Young |
| 7,284,226 B1 | 10/2007 | Kondapalli |
| 7,301,824 B1 | 11/2007 | New |
| 7,314,174 B1 | 1/2008 | Vadi et al. |
| 7,337,422 B1 | 2/2008 | Becker et al. |
| 7,345,507 B1 | 3/2008 | Young et al. |
| 7,402,443 B1 | 7/2008 | Pang et al. |
| 7,402,901 B2 | 7/2008 | Hatano et al. |
| 7,425,760 B1 | 9/2008 | Guenin et al. |
| 7,436,061 B2 | 10/2008 | Nakayama |
| 7,451,421 B1 | 11/2008 | Bauer et al. |
| 7,459,776 B1 | 12/2008 | St. Amand et al. |
| 7,491,576 B1 | 2/2009 | Young et al. |
| 7,498,192 B1 | 3/2009 | Goetting et al. |
| 7,859,119 B1 | 12/2010 | St. Amand et al. |
| 7,906,852 B2 | 3/2011 | Nishimura et al. |
| 7,999,383 B2 | 8/2011 | Hollis |
| 8,001,511 B1 | 8/2011 | Bauer et al. |
| 8,062,968 B1 | 11/2011 | Conn |
| 8,072,057 B2 | 12/2011 | Matsumura |
| 8,080,874 B1 | 12/2011 | Werner et al. |
| 8,097,957 B2 | 1/2012 | Chen et al. |
| 8,163,600 B2 | 4/2012 | Chow et al. |
| 8,227,904 B2 | 7/2012 | Braunisch et al. |
| 8,237,289 B2 | 8/2012 | Urakawa |
| 8,274,794 B2 | 9/2012 | Huang et al. |
| 8,294,490 B1 | 10/2012 | Kaviani |
| 8,295,056 B2 | 10/2012 | Andry et al. |
| 8,327,201 B1 * | 12/2012 | Lai ................... 714/725 |
| 8,338,963 B2 | 12/2012 | Haba et al. |
| 8,344,519 B2 | 1/2013 | Lu et al. |
| 8,384,411 B2 * | 2/2013 | Mooyman-Beck et al. ................ 324/762.02 |
| 8,415,783 B1 | 4/2013 | Rahman et al. |
| 8,546,955 B1 * | 10/2013 | Wu ........................ 257/777 |
| 8,615,694 B2 | 12/2013 | Whetsel ............... 714/727 |
| 8,704,364 B2 * | 4/2014 | Banijamali ............ 257/723 |
| 8,704,384 B2 * | 4/2014 | Wu et al. ............... 257/782 |
| 8,810,006 B2 * | 8/2014 | Yu et al. ................ 257/620 |
| 8,928,132 B2 * | 1/2015 | Choi et al. ............. 257/686 |
| 2002/0024146 A1 | 2/2002 | Furusawa |
| 2002/0175421 A1 | 11/2002 | Kimura |
| 2003/0079166 A1 * | 4/2003 | Vermeulen et al. ........... 714/727 |
| 2003/0183917 A1 | 10/2003 | Tsai et al. |
| 2004/0093534 A1 * | 5/2004 | Whetsel et al. ................ 714/25 |
| 2004/0184250 A1 | 9/2004 | Wang |
| 2004/0195668 A1 | 10/2004 | Sawamoto |
| 2004/0195682 A1 | 10/2004 | Kimura |
| 2004/0227223 A1 | 11/2004 | Sawamoto |
| 2005/0112614 A1 | 5/2005 | Cook et al. |
| 2005/0166106 A1 * | 7/2005 | Warren ..................... 714/724 |
| 2005/0216802 A1 * | 9/2005 | Warren ..................... 714/724 |
| 2006/0001163 A1 | 1/2006 | Kolbehdari et al. |
| 2006/0017147 A1 | 1/2006 | Drost et al. |
| 2006/0099736 A1 | 5/2006 | Nagar et al. |
| 2006/0157866 A1 | 7/2006 | Le et al. |
| 2006/0220227 A1 | 10/2006 | Marro |

(56) References Cited

U.S. PATENT DOCUMENTS

| | | |
|---|---|---|
| 2006/0226527 A1 | 10/2006 | Hatano et al. |
| 2006/0226529 A1 | 10/2006 | Kato et al. |
| 2007/0023921 A1 | 2/2007 | Zingher et al. |
| 2007/0029646 A1 | 2/2007 | Voldman |
| 2007/0101217 A1* | 5/2007 | Whetsel et al. ............... 714/724 |
| 2007/0204252 A1 | 8/2007 | Furnish et al. |
| 2007/0210428 A1 | 9/2007 | Tan et al. |
| 2007/0231966 A1 | 10/2007 | Egawa |
| 2007/0278642 A1 | 12/2007 | Yamaguchi et al. |
| 2008/0179735 A1 | 7/2008 | Urakawa |
| 2009/0057919 A1 | 3/2009 | Lin et al. |
| 2009/0267238 A1 | 10/2009 | Joseph et al. |
| 2010/0330741 A1 | 12/2010 | Huang et al. |
| 2011/0019368 A1 | 1/2011 | Andry et al. |
| 2011/0148456 A1* | 6/2011 | Mooyman-Beck et al. ....................... 324/762.02 |
| 2011/0169171 A1 | 7/2011 | Marcoux |
| 2011/0180317 A1 | 7/2011 | Takahashi et al. |
| 2011/0254162 A1 | 10/2011 | Hollis |
| 2011/0316572 A1 | 12/2011 | Rahman |
| 2012/0019292 A1* | 1/2012 | Lu et al. ....................... 327/143 |
| 2012/0020027 A1 | 1/2012 | Dungan et al. |
| 2012/0032342 A1 | 2/2012 | Min et al. |
| 2012/0124257 A1 | 5/2012 | Wu |
| 2012/0204073 A1* | 8/2012 | Whetsel ........................ 714/727 |
| 2012/0206889 A1 | 8/2012 | Norman |
| 2012/0249179 A1 | 10/2012 | Price et al. |
| 2012/0301977 A1 | 11/2012 | Andry et al. |
| 2012/0319248 A1* | 12/2012 | Rahman ........................ 257/621 |
| 2012/0324305 A1* | 12/2012 | Whetsel ........................ 714/733 |
| 2012/0331435 A1* | 12/2012 | Rahman ........................ 716/120 |
| 2013/0020675 A1* | 1/2013 | Kireev et al. ................. 257/531 |
| 2013/0022136 A1* | 1/2013 | Collins ........................ 375/259 |
| 2013/0093074 A1* | 4/2013 | Grant ............................ 257/693 |
| 2013/0134553 A1 | 5/2013 | Kuo et al. |
| 2013/0181360 A1* | 7/2013 | Kim et al. .................... 257/777 |
| 2013/0200511 A1* | 8/2013 | Banijamali ................... 257/737 |
| 2013/0214432 A1* | 8/2013 | Wu et al. ...................... 257/782 |
| 2013/0252378 A1* | 9/2013 | Jeng et al. .................... 438/107 |
| 2013/0333921 A1* | 12/2013 | Hisamura ..................... 174/250 |
| 2014/0013174 A1* | 1/2014 | Whetsel ........................ 714/727 |
| 2014/0070423 A1 | 3/2014 | Woychik et al. |
| 2014/0077391 A1 | 3/2014 | Kikuchi et al. |
| 2014/0084459 A1 | 3/2014 | Yue et al. |

OTHER PUBLICATIONS

Chi, Chun-Chuan et al., "Post-Bond Testing of 2.5D-SICs and 3D-SICs Containing a Passive Silicon Interposer Base," *Proc. of the 2011 IEEE International Test Conference*, Sep. 20, 2011, pp. 1-10, IEEE, Piscataway, New Jersey, USA.

Specification and drawings for U.S. Appl. No. 13/369,215, filed Feb. 8, 2012, Banijamali.

Specification and drawings for U.S. Appl. No. 13/399,939, filed Feb. 17, 2012, Wu et al.

Specification and drawings for U.S. Appl. No. 13/527,453, filed Jun. 19, 2012, Hisamura.

Specification and drawings for U.S. Appl. No. 13/535,102, filed Jun. 27, 2012, Camarota.

Specification and drawings for U.S. Appl. No. 13/13/935,066, filed Jul. 3, 2013, Camarota.

* cited by examiner

1100

| Bypass Signal Mode | Instruction Register | Feed-Through Bypass Signal | Bypass Enable Signal | Signal Passed as TDO |
|---|---|---|---|---|
| High | Test-Logic-Reset | Not Used | Output:Tri-stated | TDI as 1035 |
| High | Feed-Through | Not Used | Output:Tri-stated | TDI as 1035 |
| High | Bypass | Not Used | Output:Tri-stated | TDI as 1035 |
| High | High-Z | Not Used | Output:Tri-stated | TDI as 1035 |
| High | Other | Not Used | Output: Low | TDI as 1040 |
| Low | Test-Logic-Reset | Bypass-Input | Output: Tri-Stated Input: Low | TDI as 1035 |
| Low | Test-Logic-Reset | Bypass-Input | Output: Tri-Stated Input: High | Feed-Through Bypass as 1035 |
| Low | Feed-Through | Bypass-Input | Output: Tri-Stated Input: Low | TDI as 1035 |
| Low | Feed-Through | Bypass-Input | Output: Tri-Stated Input: High | Feed-Through Bypass as 1035 |
| Low | Bypass | Bypass-Input | Output: Tri-Stated Input: Low | TDI as 1035 |
| Low | Bypass | Bypass-Input | Output: Tri-Stated Input: High | Feed-Through Bypass as 1035 |
| Low | High-Z | Bypass-Input | Output: Tri-Stated Input: Low | TDI as 1035 |
| Low | High-Z | Bypass-Input | Output: Tri-Stated Input: High | Feed-Through Bypass as 1035 |
| Low | Other | Bypass-Input | Output: Low Input: Low | TDI as 1040 |

FIG. 11

FLEXIBLE SIZED DIE FOR USE IN MULTI-DIE INTEGRATED CIRCUIT

FIELD OF THE INVENTION

One or more embodiments disclosed within this specification relate to integrated circuits (ICs). More particularly, one or more embodiments relate to integrated circuits formed using dies.

BACKGROUND

Multi-die integrated circuits (ICs) are a class of ICs in which multiple dies are placed within a single package. A multi-die IC also can be referred to as a "system in a package" or "SiP." A multi-die IC can include circuit structures that allow the dies to communicate with one another within the single package at faster speeds than would be attainable were the dies to be implemented as separate ICs or as individual IC packages mounted on a printed circuit board.

Creating a mask set for a modern integrated circuit is a costly endeavor. A "mask set" refers to electronic data that defines the geometry for the lithography steps of semiconductor fabrication. Each physical mask that is generated is referred to as a "photomask." The phrase "mask set" refers to the collection of such photomasks required to make a particular die.

Since each die requires a mask set, one can see that the photomask cost for a multi-die IC can far exceed the photomask cost for a single die IC. The additional cost extends to the situation in which different variations (e.g., product lines or families) of the multi-die IC are developed. Typically, the creation of additional product lines for multi-die ICs involves switching one or more dies of the multi-die IC in favor of one or more other alternative dies, e.g., of larger or smaller capacity depending upon the product line requirements. Unfortunately, the need to generate a mask set for each die used in creating a multi-die IC product family can be cost prohibitive.

SUMMARY

One or more embodiments disclosed within this specification relate to integrated circuits (ICs) and, more particularly, to integrated circuits formed using multiple dies. An IC structure can include a first die and a second die. The second die can include a first base unit and a second base unit. Each of the first base unit and the second base unit is self-contained. No signals pass between the first base unit and the second base unit within the second die. The IC structure also can include an interposer. The interposer can include a first plurality of inter-die wires coupling the first die to the first base unit, a second plurality of inter-die wires coupling the first die to the second base unit, and a third plurality of inter-die wires coupling the first base unit to the second base unit. A JTAG interface for an IC can include a JTAG controller configured to receive a Test Data In signal and generate a registered version of the Test Data In signal as a first intermediate Test Data Out signal, a first selector configured to pass a Feed-Through Bypass signal or the Test Data In signal as a second intermediate Test Data Out signal under control of the JTAG controller, and a second selector configured to pass the first intermediate Test Data Out signal or the second intermediate Test Data Out signal under control of the JTAG controller. An integrated circuit die can include a first base unit and a second base unit. Each of the first base unit and the second base unit is self-contained, separated by a scribe area, and no signals pass between the first base unit and the second base unit within the integrated circuit die.

BRIEF DESCRIPTION OF THE DRAWINGS

FIG. 11 is a table illustrating operational states of the JTAG interface of FIG. 10.

DETAILED DESCRIPTION

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

The exemplary structures disclosed within this specification relate to integrated circuits (ICs) and, more particularly, to integrated circuits formed using multiple dies. In accordance with the inventive arrangements disclosed within this specification, an IC formed of multiple dies, referred to as a "multi-die IC," can be constructed using at least one die that includes "N" base units, where N is an integer value. The base units are formed on a wafer in which the base units are identical and are spaced apart using scribe lines. The base units can be physically separated along selected scribe lines to form dies that include N base units in which N is equal to 1, 2, 3, 4, etc., from a single wafer.

Once separated into dies of N base units (referred to herein as a base unit die), each base unit die can be combined with one or more other dies within a single package as a multi-die IC. In one aspect, the multiple dies can be combined using stacked silicon interconnect (SSI) technology. By varying the number of base units within the base unit dies, different multi-die IC products can be created without unduly increasing the number of mask sets required. For example, a base unit die having two base units can be combined with a selected die to create a first multi-die IC product. A base unit die having three base units that is obtained from the same wafer as the base unit die having two base units can be combined with the selected die to create a second and different multi-die IC product. The second multi-die IC product can be produced without any additional mask sets beyond those needed to fabricate the first multi-die IC product.

Figure 1:
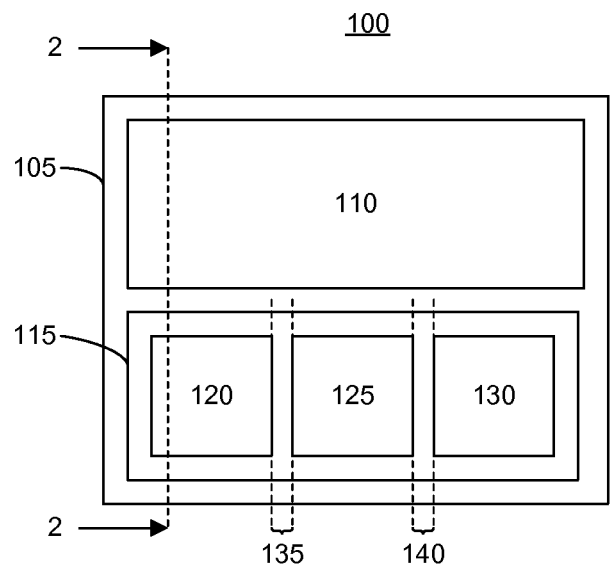
FIG. 1 is a first block diagram illustrating a topographic view of an IC structure (IC structure).

FIG. 1 is a first block diagram illustrating a topographic view of an IC structure 100. IC structure 100 is an example of a multi-die IC structure. As illustrated, IC structure 100 depicts an example of a packing approach that can be used to stack multiple dies of an IC within a single package. IC structure 100 can include an interposer 105, a die 110, and a die 115.

IC structure 100 is an example of SSI technology and, as such, can be referred to as an SSI structure. In general, an SSI structure and/or SSI technology refer to a multi-die IC structure in which an interposer is utilized to couple one or more other dies. The interposer is formed using any of a variety of materials and includes one or more inter-die wires that couple two or more different dies mounted on the interposer. The interposer also can include one or more through-silicon vias (TSVs). The dies typically are coupled to the interposer using solder bumps, but this need not be the case.

Interposer 105 can be a die having a planar surface on which dies 110 and 115 can be horizontally stacked. As shown, dies 110 and 115 can be located side-by-side on the planar surface of interposer 105. Although implemented with two horizontally stacked dies within FIG. 1, IC structure 100 also can be implemented with more than two dies being stacked on the planar surface of interposer 105. For example, IC structure 100 can have 3, 4, or more dies mounted on the planar surface of interposer 105. In another embodiment, die 115 can be stacked vertically on top of die 110. In still another embodiment, interposer 105 can be used as an intermediate layer between two vertically stacked dies. In that case, interposer 105 can isolate vertically stacked dies from one another within a multi-die IC package.

Interposer 105 can provide a common mounting surface and electrical coupling point for two or more dies of an SSI device. Interposer 105 can serve as an intermediate layer for interconnect routing between dies or as a ground or power plane for IC structure 100. In one aspect, interposer 105 can be implemented with a silicon wafer substrate, whether doped or un-doped with an N-type and/or a P-type impurity. The manufacturing of interposer 105 can include one or more additional process steps that allow the deposition of one or more layer(s) of metal interconnect. These metal interconnect layers can include aluminum, gold, copper, nickel, various silicides, and/or the like.

Interposer 105 can be manufactured using one or more additional process steps that allow the deposition of one or more dielectric or insulating layer(s) such as, for example, silicon dioxide. In general, interposer 105 can be implemented as a passive die in that interposer 105 can include no active circuit elements. In another aspect, however, interposer 105 can be manufactured using one or more additional process steps that allow the creation of active circuit elements such as, for example, transistor devices and/or diode devices. As noted, interposer 105 is, in general, a die and is characterized by the presence of one or more TSVs and inter-die wires as will be described in greater detail within this specification.

Implementation of interposer 105 within this specification as a silicon interposer is provided for purposes of illustration only. Other types of interposers and corresponding structures within the interposers can be used. For example, interposers formed of organic materials, glass, or the like can be used. In this regard, other structures such as through-glass vias (TGVs) can be included in the case of a glass interposer. Accordingly, the various structures and materials disclosed within this specification are provided for purposes of illustration and, as such, are not intended as limitations of the one or more embodiments disclosed herein.

Die 110 and die 115 communicate with one another only through interposer 105. Die 115 is implemented as a base unit die having N base units. In the example pictured in FIG. 1, N is equal to three. Accordingly, die 115 includes base units 120, 125, and 130. Each of base units 120, 125, and 130 is identical. Die 110 communicates with each of base units 120, 125, and 130 only through interposer 105. Similarly, base units 120-130 do not communicate with one another through die 115. Rather, base units 120-130 communicate with one another only through interposer 105 despite being part of a same die.

Within die 115, each of base units 120-130 is entirely self-contained. Each of base units 120-130 includes all resources necessary for wafer sort testing, power, ground, clock generation, e.g., phase locked-loops (PLLs), Joint Test Action Group (JTAG) circuitry, and the like. The JTAG circuitry refers to a JTAG testing interface implementation as defined by the IEEE Standard 1149.1-1990. In one aspect, for example, base unit 120 is separated from base unit 125 by a scribe line 135. Similarly, base unit 125 is separated from base unit 130 by a scribe line 140. A "scribe line" refers to an area typically including many of the various processing layers, e.g., diffusion layers and metal layers, which form the dies on a wafer. A scribe line does not include any circuit structures. A scribe line on a wafer is an area in which the structures, e.g., dies, of a wafer are physically separated from one another when wafer processing is complete. A scribe line also can be referred to as a "scribe area," "scribe," or "die-seal."

Base units 120-130 can be said to be within a scribe ring which defines the perimeter of die 115 as will be described in further detail with reference to FIG. 4.

Die 110 and die 115 can be implemented as any of a variety of different types of dies such as, for example, Random Access Memories (RAMs), central processing units, programmable ICs, analog-to-digital (AD) converters, digital-to-analog (DA) converters, Application Specific Integrated Circuits (ASICs), or the like. In one aspect, die 110 and die 115 each can be implemented as a same type of die, e.g., both as programmable ICs, both as memories, etc. In that case, while both can be of a same type, the two dies can be identical or can have different structures, architectures, and/or capacities. In another aspect, each of dies 110 and 115 can be implemented as a different type of die. For example, die 110 can be implemented as a programmable IC, while die 115 is implemented as a RAM or as an ASIC.

In one example, die 110 can be implemented as a programmable IC such as a Field Programmable Gate Array (FPGA) while die 115 is implemented as an ASIC in which each of base units 120-130 is an identical circuit block. For example, each of base units 120-130 can be implemented as a high-speed serial input/output (HSSIO), as a DA converter, as an AD converter, or the like.

Despite the particular type of circuit block used to implement base units 120-130 of die 115, each can be implemented with a pitch corresponding to the connection density requirements for connecting die 115 to interposer 105. With the proper pitch, multiple different sized versions of die 115 can be formed including 1, 2, 3, 4, or more base units according to how a wafer including the base units is diced.

It should be appreciated that were die 115 to be separated into two or more individual dies, e.g., where each of base units 120-130 is a separate die, the spacing requirements for mounting each respective die on interposer 105 would be significantly larger than the case where two or more base units are included in a single die. In other words, as mounted on interposer 105, the spacing between base unit 120 and base unit 125 within a single die, e.g., die 115, is less than the spacing between base unit 120 and base unit 125 had each been implemented as a separate die, e.g., base unit 120 been physically separated from base unit 125 by cutting along scribe line 135. Further the cost of assembly of a multi-die IC structure built using SSI technology utilizing an interposer such as interposer 105 depends upon the number of dies attached to the interposer. Thus, by including two or more base units in a single die despite each base unit only being communicatively linked to other base units via interposer 105, less area on interposer 105 is used and less cost is incurred.

Figure 2:
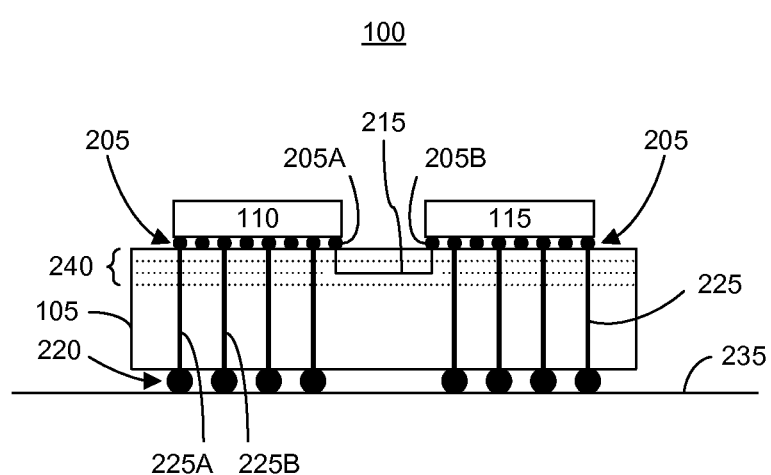
FIG. 2 is a second block diagram illustrating a cross-sectional side view of an IC structure.

FIG. 2 is a second block diagram illustrating a cross-sectional side view of an IC structure. More particularly, FIG. 2 illustrates a view of IC structure 100 of FIG. 1 taken along cut-line 2-2. As such, like numbers will be used to refer to the same items throughout this specification.

Referring to FIG. 2, each of dies 110 and 115 can be electrically coupled to interposer 105 via solder bumps 205. Solder bumps 205 can be implemented using any of a variety of different types of solder bumps. Examples of different types of solder bumps that can be used include, but are not limited to, copper pillars, silver-tin (Ag—Sn) bumps, lead-tin bumps, copper-tin bumps, or the like. Each of solder bumps 205 can serve to physically attach dies 110 and 115 to interposer 105. Through solder bumps 205, for example, interposer 105 is coupled to die 110. Similarly, through solder bumps 205, die 115 (including base units 120-130 not shown) is coupled to interposer 105. In an embodiment, solder bumps 205 can be implemented in the form of "micro-bumps."

Although the coupling of dies 110 and 115 to interposer 105 can be accomplished through solder bumps 205, a variety of other techniques can be used to couple interposer 105 to dies 110 and 115. For example, bond wires or edge wires can be used to couple dies 110 and 115 to interposer 105. In another example, an adhesive material can be used to physically attach dies 110 and 115 to interposer 105. As such, the coupling of dies 110 and 115 to interposer 105 via solder bumps 205, as illustrated within FIG. 2, is provided for purposes of illustration and is not intended to limit the one or more embodiments disclosed within this specification.

Interconnect material within interposer 105 can be used to form inter-die wires that pass inter-die signals between dies 110 and 115. A region labeled 240 of interposer 105 can include one or more conductive, e.g., patterned metal, layers forming wires or interconnects. For example, interconnect 215 can be formed using one or more of the patterned metal layers of region 240. Accordingly, interconnect 215 represents an inter-die wire that couples solder bump 205A to solder bump 205B, thereby coupling die 110 to die 115 and allowing the exchange of inter-die signals between dies 110 and 115.

In addition, interposer 105 can be implemented with multiple conductive layers that can be coupled together with vias (not shown). In that case, interconnect 215 can be implemented using two or more conductive layers coupled together using vias within interposer 105. The use of multiple conductive layers to implement interconnects, e.g., inter-die wires, within interposer 105 allows a greater number of signals to be routed and more complex routing of signals to be achieved within interposer 105.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

Solder bumps 220 can be used to electrically couple interposer 105 to a surface 235. Surface 235 can represent, for example, a multi-die IC package in which IC structure 100 is implemented. Solder bumps 220 further can couple IC structure 100 directly to a node external to the multi-die IC package. In an embodiment, solder bumps 220 can be implemented in the form of "controlled collapse chip connection" or "C4" bumps. For example, solder bumps 220 can be used to physically attach interposer 105 to surface 235. TSVs 225 represent vias that, when filled with conductive material, form an electrical connection that vertically transverses, e.g., extends through a substantial portion, if not the entirety of, interposer 105.

TSVs 225 can be implemented by drilling or etching an opening into interposer 105 that extends from a first planar surface, i.e., the surface to which solder bumps 205 are coupled, through to a second planar surface, i.e., the surface to which solder bumps 220 are coupled. Conductive material then can be deposited within TSVs 225. Examples of conductive material that can be used to fill TSVs 225 can include, but are not limited to, aluminum, gold, copper, nickel, various silicides, and/or the like. In another example, TSVs 225 can traverse substantially through interposer 105 to couple solder bumps 220 with one or more metal layers of region 240 as are used to form interconnect 215. Interconnect 215 and one or more conventional vias then can couple TSVs 225 to solder bumps 205.

As discussed, other technologies can be used to implement interposer 105. To the extent that other technologies are utilized with other corresponding structures, e.g., TGVs, the phrase "through-via" (TV) can be used to refer to a TSV, a TGV, or other structure representing a conductor that extends through, or substantially through, an interposer structure. In any case, referring again to FIG. 2, TSVs 225, in combination with solder bumps 220, couple die 110 and die 115 to surface 235. As shown within FIG. 2, the first planar surface of interposer 105 can be physically coupled to dies 110 and 115. The second planar surface of interposer 105 can be physically coupled to surface 235.

While individual base units of die 115 are not illustrated in FIG. 2, as discussed, communication between individual base units does not take place within die 115. Rather, communication between individual base units, to the extent required if at all, occurs through interposer 105 using the various inter-die wires illustrated in FIG. 2. This allows each of the base units to be implemented in an identical manner and be spaced in a wafer by scribe lines thereby allowing the creation of dies with varying numbers of base units.

Figure 3:
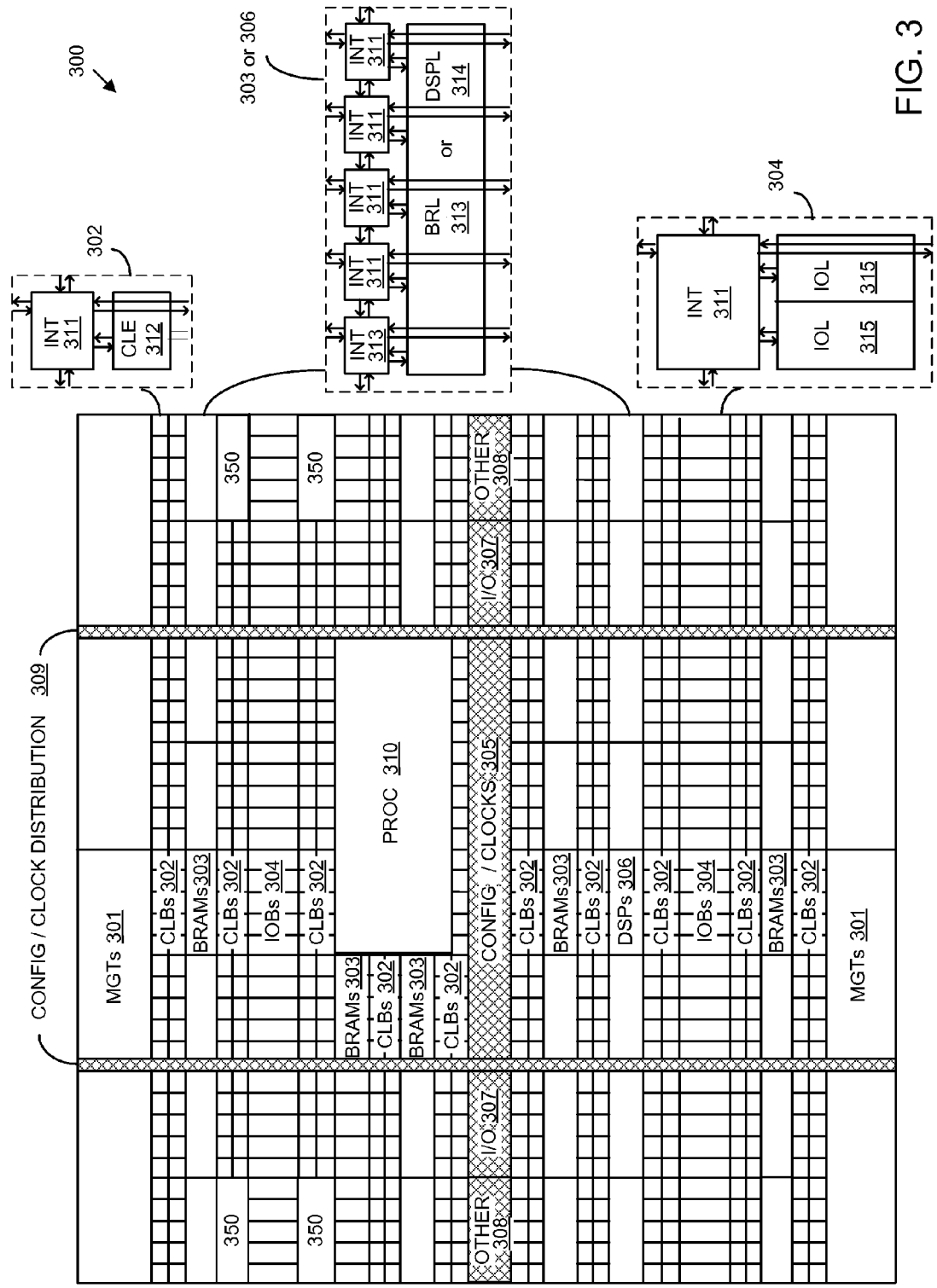
FIG. 3 is a third block diagram illustrating an exemplary architecture for a programmable die.

FIG. 3 is a third block diagram illustrating an exemplary architecture 300 for a programmable die. Architecture 300 can be used to implement an FPGA type of die, for example. As shown, architecture 300 includes several different types of programmable circuit, e.g., logic, blocks. For example, architecture 300 can include a large number of different programmable tiles including multi-gigabit transceivers (MGTs) 301, configurable logic blocks (CLBs) 302, RAM blocks (BRAMs) 303, input/output blocks (IOBs) 304, configuration and clocking logic (CONFIG/CLOCKS) 305, digital signal processing blocks (DSPs) 306, specialized I/O blocks 307 (e.g., configuration ports and clock ports), and other programmable logic 308 such as digital clock managers, AD converters, system monitoring logic, and so forth.

In some dies, each programmable tile includes a programmable interconnect element (INT) 311 having standardized connections to and from a corresponding INT 311 in each adjacent tile. Therefore, the INTs 311, taken together, implement the programmable interconnect structure for the illustrated die. Each INT 311 also includes the connections to and from the programmable logic element within the same tile, as shown by the examples included at the top of FIG. 3.

For example, a CLB 302 can include a configurable logic element (CLE) 312 that can be programmed to implement user logic plus a single INT 311. A BRAM 303 can include a BRAM logic element (BRL) 313 in addition to one or more INTs 311. Typically, the number of INTs 311 included in a tile depends on the height of the tile. In the pictured embodiment, a BRAM tile has the same height as five CLBs, but other numbers (e.g., four) can also be used. A DSP tile 306 can include a DSP logic element (DSPL) 314 in addition to an appropriate number of INTs 311. An 10B 304 can include, for example, two instances of an I/O logic element (IOL) 315 in addition to one instance of an INT 311. As will be clear to those of skill in the art, the actual I/O pads connected, for example, to IOL 315 typically are not confined to the area of IOL 315.

In the example pictured in FIG. 3, a columnar area near the center of the die, e.g., formed of regions 305, 307, and 308, can be used for configuration, clock, and other control logic. Horizontal areas 309 extending from this column are used to distribute the clocks and configuration signals across the breadth of the programmable IC.

Architecture 300 further include one or more interfaces 350. Each interface 350 is a die-to-die interface described in greater detail with reference to FIGS. 5 and 6 of this specification. In general, interface 350 is implemented as a programmable data path and configuration buffer that facilitates die-to-die communications. More particularly, interface 350 supports communications from a die in which architecture 300 is implemented to a base unit. It should be appreciated that architecture 300 can include more than one interface 350. In one aspect, architecture 300 includes one interface 350 for each base unit with which the die in which architecture 300 is implemented is to communicate.

Some ICs utilizing the architecture illustrated in FIG. 3 include additional logic blocks that disrupt the regular columnar structure making up a large part of the IC. The additional logic blocks can be programmable blocks and/or dedicated circuitry. For example, a processor block depicted as PROC 310 spans several columns of CLBs and BRAMs.

In one aspect, PROC 310 is implemented as a dedicated circuitry, e.g., as a hard-wired processor, that is fabricated as part of the die that implements the programmable circuitry of the IC. PROC 310 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 310 is omitted from architecture 300 and replaced with one or more of the other varieties of the programmable blocks described. Further, such blocks can be utilized to form a "soft processor" in that the various blocks of programmable circuitry can be used to form a processor that can execute program code as is the case with PROC 310.

The phrase "programmable circuitry" can refer to programmable circuit elements within an IC or die, e.g., the various programmable or configurable circuit blocks or tiles described herein, as well as the interconnect circuitry that selectively couples the various circuit blocks, tiles, and/or elements according to configuration data that is loaded into the die. For example, portions shown in FIG. 3 that are external to PROC 310 such as CLBs 303 and BRAMs 303 can be considered programmable circuitry of the die.

In general, the functionality of programmable circuitry is not established until configuration data is loaded into the die. A set of configuration bits can be used to program programmable circuitry of a die such as an FPGA. The configuration bit(s) typically are referred to as a "configuration bitstream." In general, programmable circuitry is not operational or functional without first loading a configuration bitstream into the die. The configuration bitstream effectively implements or instantiates a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the die, e.g., PROC 310 and/or interface 350.

In some instances, hardwired circuitry can have one or more operational modes that can be set or selected according to register settings or values stored in one or more memory elements within the die. The operational modes can be set, for example, through the loading of a configuration bitstream into the die. Despite this ability, hardwired circuitry is not considered programmable circuitry as the hardwired circuitry is operable and has a particular function when manufactured as part of the die.

FIG. 3 is intended to illustrate an exemplary architecture that can be used to implement a die that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 3 are purely exemplary. In an actual die, for example, more than one adjacent column of CLBs is typically included wherever the CLBs appear, to facilitate the efficient implementation of a user circuit design. The number of adjacent CLB columns, however, can vary with the overall size of the die. Further, the size and/or positioning of blocks such as PROC 310 within the die are for purposes of illustration only and are not intended as a limitation of the one or more embodiments disclosed within this specification.

Referring to FIG. 1, for example, architecture 300 of FIG. 3 can be implemented within die 110. It should be appreciated, however, that the architecture implemented within die 110 need not include all elements described with reference to FIG. 3. Die 110, for example, can include any subset of elements described in FIG. 3. In one aspect, however, die 110 includes interface 350. Similarly, die 115 can include any subset of the elements described with reference to FIG. 3. In a particular aspect, one or more or all of the elements included in die 110 and die 115 can be mutually exclusive in that any element type or block included in one die of IC structure 100 is not included in any other die of IC structure 100 to avoid overlapping functionality. In another aspect, however, dies 110 and 115 can include one or more same types of elements with overlapping functionality.

Figure 4:
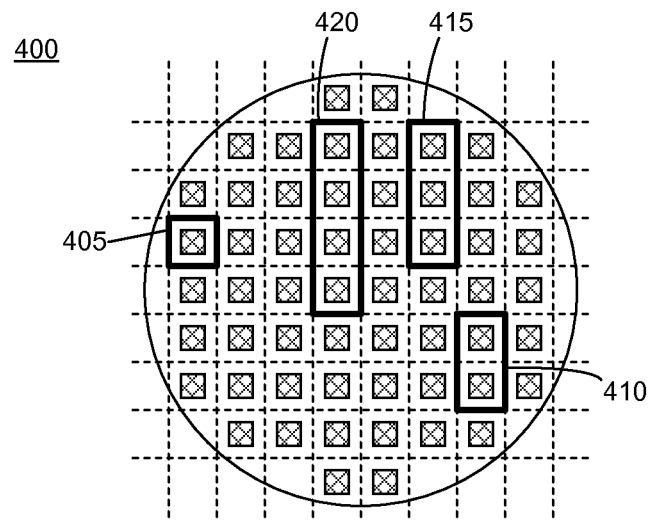
FIG. 4 is a fourth block diagram illustrating an exemplary wafer.

FIG. 4 is a fourth block diagram illustrating an exemplary wafer 400. Each shaded square region on wafer 400 represents a base unit. As pictured, each base unit is spaced from each other base unit by a scribe line or area. Each base unit is identical to each other base unit. By placing a scribe line between each base unit as shown, dies having different numbers of base units can be created from wafer 400.

For example, a die having a single base unit can be generated from wafer 400 if physically separated from wafer 400 according to scribe ring 405 shown in heavy outline. The perimeter of the die is defined by scribe ring 405. A die having two base units can be generated from wafer 400 if physically separated from wafer 400 according to scribe ring 410 shown in heavy outline. The perimeter of the die is defined by scribe ring 410. As another example, a die having three base units and a die having four base units can be generated from wafer 400 if physically separated from wafer 400 using scribe rings 415 and 420 respectively. The perimeter of the die having three base units is defined by scribe ring 415. The perimeter of the die having four base units is defined by scribe ring 420.

The examples illustrated in FIG. 4 are for purposes of illustration only. It should be appreciated that dies with varying numbers of base units can be obtained depending upon the particular pattern of scribe lines used to dice wafer 400. Referring to FIG. 1, die 115 is an example of a die having three base units that can be generated from wafer 400.

Figure 5:
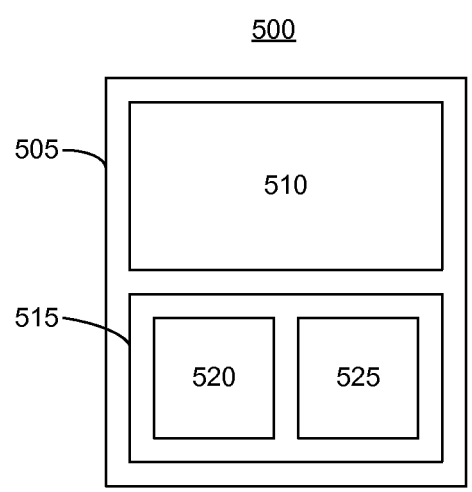
FIG. 5 is a fifth block diagram illustrating a topographic view of an IC structure.

FIG. 5 is a fifth block diagram illustrating a topographic view of an IC structure (IC structure) 500. IC structure 500 is a multi-die IC that can be implemented similar to IC structure 100 of FIG. 1. IC structure 500 is implemented using SSI technology. As pictured, IC structure 500 includes an interposer 505 on which die 510 and die 515 are mounted. In this example, die 510 is used, for example, in place of die 110. IC structure 500 can be a smaller version of IC structure 100, e.g., a different family of multi-die IC that provides similar, but lesser functionality than IC structure 100. Whereas IC structure 100 of FIG. 1 includes die 115 having three base units, IC structure 500 of FIG. 5 includes die 515 having only two base units 520 and 525. Base units 520 and 525 can be identical to one another and can be identical to base unit 120. Die 515 can be obtained from a wafer as described with reference to FIGS. 1 and 4, i.e., a same wafer from which die 115 is obtained.

As discussed, each base unit is a separate and independent circuit block on a die. In one aspect, while each base unit implements a programmable IC architecture as illustrated with reference to FIG. 3. In another aspect, each base unit implements fixed, or substantially fixed, circuitry in which one or more different operation modes are implemented response to the loading of configuration data. For example, consider the case in which each base unit implements an HSSIO. Each HSSIO can be configurable to implement one or more different operation modes that, for implementation, require configuration from another die, e.g., a master die, within the multi-die IC structure.

Each base unit, when implementing an HSSIO, for example, can implement one or more operating modes. Each operating mode can specify various attributes for the transceiver included within the HSSIO interface. For example, the transceiver can be configured to communicate at 1, 2, 3, 4, 5 or more gigabits per second (gbps). The transceiver can be configured to communicate using one of a plurality of different communication protocols such as Peripheral Component Interconnect (PCI) Express, Gigabit Attachment Unit Interface (XAUI), or the like. The operating mode further specifies settings for devices such as multiplexers, de-multiplexers, flip-flops, decoding patterns, cyclic redundancy checks (CRCs), and the like. Thus, each operating mode for the base unit can specify a communication speed, a communication protocol, and the various other parameters described. It should be appreciated that the particular operating mode implemented within each base unit depends upon the configuration data loaded into the base unit and that each base unit, regardless of whether other base units are located on the same die, is independently configurable from each other base unit.

Accordingly, in one aspect, each base unit has a dedicated configuration path from the master die (e.g., die 110 or die 510) used to configure the base unit. In another aspect, configuration data can be provided to a first base unit and then cascaded from one base unit to the next serially. In either case, whether configuration information is cascaded from base unit to base unit or provided to each base unit independently by a master die, the connections of the data path are formed or implemented through interposer 505 (or interposer 105 in the case of FIG. 1).

Figure 6:
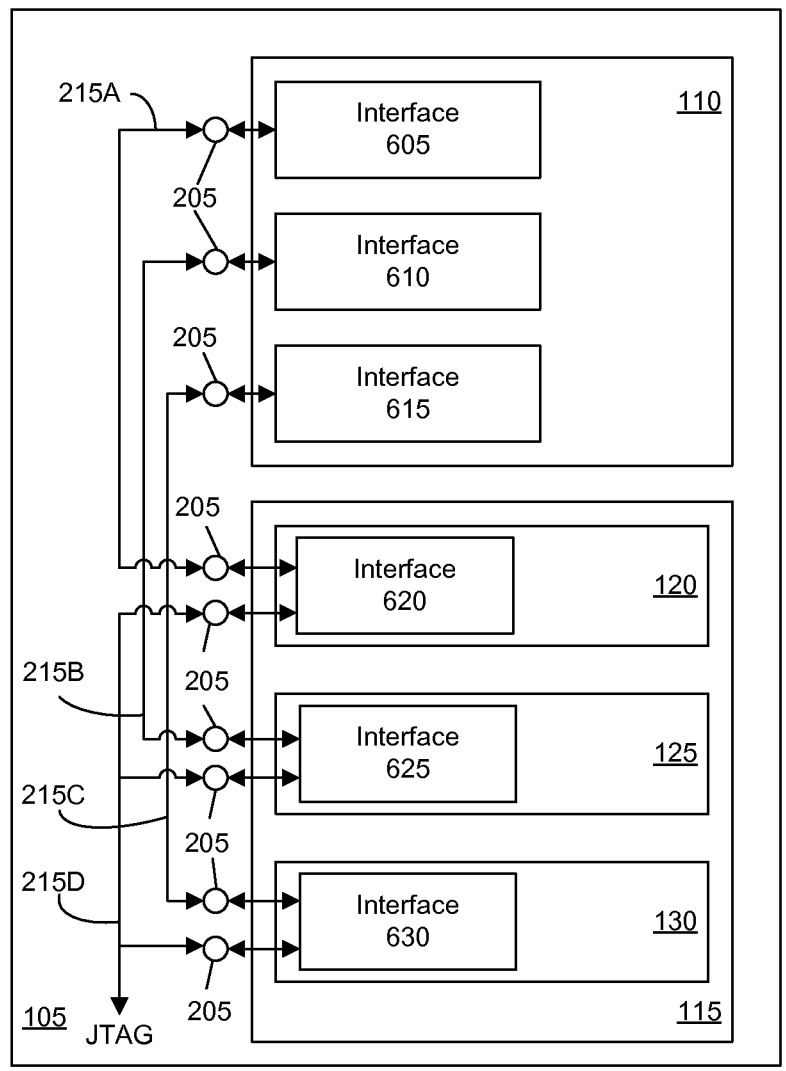
FIG. 6 is a sixth block diagram illustrating another aspect of the IC structure described with reference to FIGS. 1 and 2.

FIG. 6 is a sixth block diagram illustrating another aspect of IC structure 100 of FIGS. 1 and 2. For purposes of illustration, die 110 is implemented as a programmable IC such as an FGPA, though the embodiments disclosed within this specification are not limited in this regard. As shown, die 110 includes interfaces 605, 610, and 615. Die 110 includes one interface for each base unit within die 115. For example, each of interfaces 605, 610, and 615 can be implemented as interface 350 as described with reference to FIG. 3. Accordingly, each of base units 120, 125, and 130 includes a respective one of interfaces 620, 625, and 630.

As shown, interface 605 couples to interface 620 via solder bumps 205 and inter-die wire 215A which, as discussed, is located within interposer 105. Interface 610 couples to interface 625 via solder bumps 205 and inter-die wire 215B located within interposer 105. Similarly, interface 615 couples to interface 630 via solder bumps 205 and inter-die wire 215C within interposer 105. It should be appreciated that each of inter-die wires 215A-215C can represent a plurality of inter-die wires, e.g., tens, hundreds, or thousands of inter-die wires. In this regard, each of solder bumps 205 can represent a plurality of bumps to facilitate a multi-bit parallel interface between each base unit 120-130 and die 110.

As shown in FIG. 6, base units 120-130 are also coupled together through inter-die wires 215D. Inter-die wires 215D can represent a plurality of inter-die wires associated with the JTAG function. Inter-die wires 215D can represent parallel connections between base units 120-130, serial connections between base units 120-130, or a combination of parallel and serial connections. The JTAG interconnections are described in more detail in connection with FIG. 9.

As illustrated in FIG. 6, each of base units 120-130 has an independent interface that communicates with a base-unit specific interface within die 110. Using the appropriate interface 605-615, die 110 can program each of base units 120-130 independently of one another and/or in parallel. In this regard, each of interfaces 605-615 and each of interfaces 620-630 can include a complete complement of configuration and power-up initialization signals. For example, each interface between die 110 and one of base units 120-130 can include a data path channel, a control channel, and a dynamic reconfiguration port (DRP).

Figure 7:
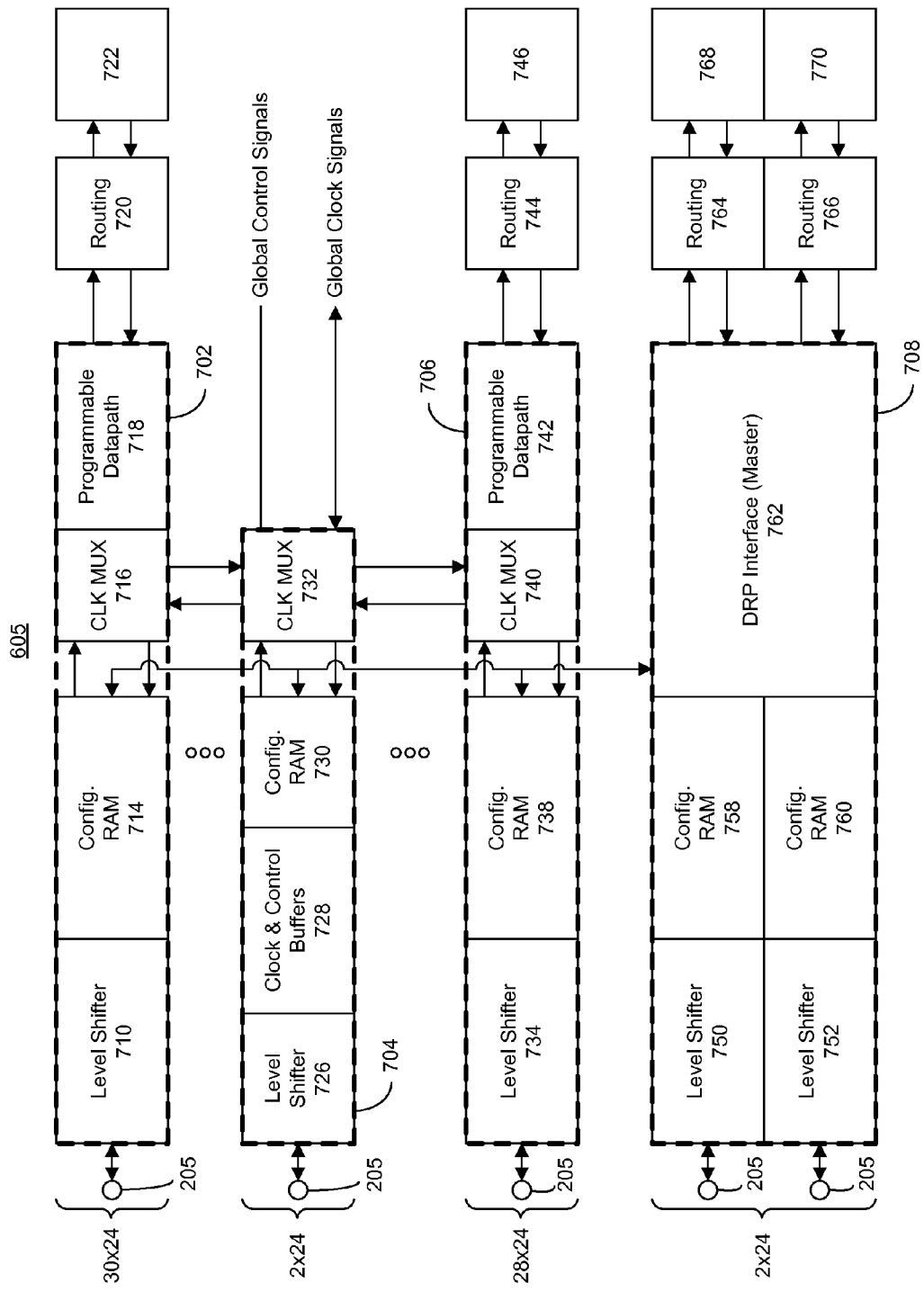
FIG. 7 is a seventh block diagram illustrating an exemplary implementation of an interface of FIG. 6.

FIG. 7 is a seventh block diagram illustrating an exemplary implementation of interface 605 of FIG. 6. As discussed, die 110 can be implemented in the form of a programmable IC such as an FPGA. Each of interfaces 605-615 can be implemented in the same or similar manner as described with reference to FIG. 7 using available resources of die 110.

Interface 605 can include three different channels including a data path channel, a control channel, and a DRP. A data path channel available for conveying user data includes blocks 702 and 706. Block 702 can provide 30 sub-channels with each sub-channel including 24 signal wires, e.g., a 24 bit parallel interface. Block 706 can provide 28 sub-channels with each sub-channel including 24 signal wires, e.g., a 24 bit parallel interface.

Block 702 includes a level shifter 710 and configuration RAM 714. Block 702 further can include a clock multiplexer block 716 and a programmable data path 718. As shown, programmable data path 718 couples to routing circuitry 720 of die 110, which further couples to circuitry 722. Circuitry 722 represents programmable circuitry within die 110 such as a user implemented circuit design within die 110.

Block 706 includes a level shifter 734 and configuration RAM 738. Block 706 further can include a clock multiplexer block 740 and a programmable data path 742. As shown, programmable data path 742 couples to routing circuitry 744 of die 110, which further couples to circuitry 746. Circuitry 746 represents programmable circuitry within die 110 such as a user implemented circuit design within die 110.

The control channel of interface 605 is implemented by block 704. Block 704 can provide 2 sub-channels with each sub-channel including 24 signal wires, e.g., a 24 bit parallel interface. As shown, block 704 includes a level shifter 726, clock and control buffers 728, configuration RAM 730, and a clock multiplexer block 732. Global control signals and global clock signals are provided from circuitry within die 110 to clock multiplexer block 732 for distribution to other clock multiplexer blocks as shown.

The DRP of interface 605 is implemented by block 708. Block 708 can provide 2 sub-channels with each sub-channel including 24 signal wires, e.g., a 24 bit parallel interface. As shown, block 708 includes level shifters 750 and 752, configuration RAMs 758 and 760, and a DRP interface 762. DRP interface 762 functions as a master and couples to routing circuitry 764 and 766 of die 110. Routing circuitry 764 and 766 couple to circuitry 768 and 770, respectively, within die 110.

DRP interface 762 is coupled to the configuration RAMs 714, 730, 738, 758, and 760 via a configuration RAM read/write port. DRP interface 762 is configured to transfer frames of configuration data received from various sources to configuration RAMs 714, 730, 738, 758, and 768 and, further, to transmit configuration data to a base unit, e.g., interface 620 of base unit 605, for storage within configuration RAM therein.

The DRP interface of each base unit further allows the base unit to be updated or fine tuned while operational, e.g., in the field. For example, during operation, a filter or other circuitry can be tuned dynamically in the field by providing updated configuration information to the base unit via the DRP. The same port, e.g., the DRP, that facilitates this dynamic update ability is leveraged for purposes of the independent base units for configuration at power up. Since each base unit requires a DRP for in the field configuration, the DRP can be used to initially configure each base unit from the other die without having to add additional ports or circuitry to the base units. In this manner, isolating the base units as described does not incur additional overhead in terms of added circuitry as each base unit already includes a DRP.

Figure 8:
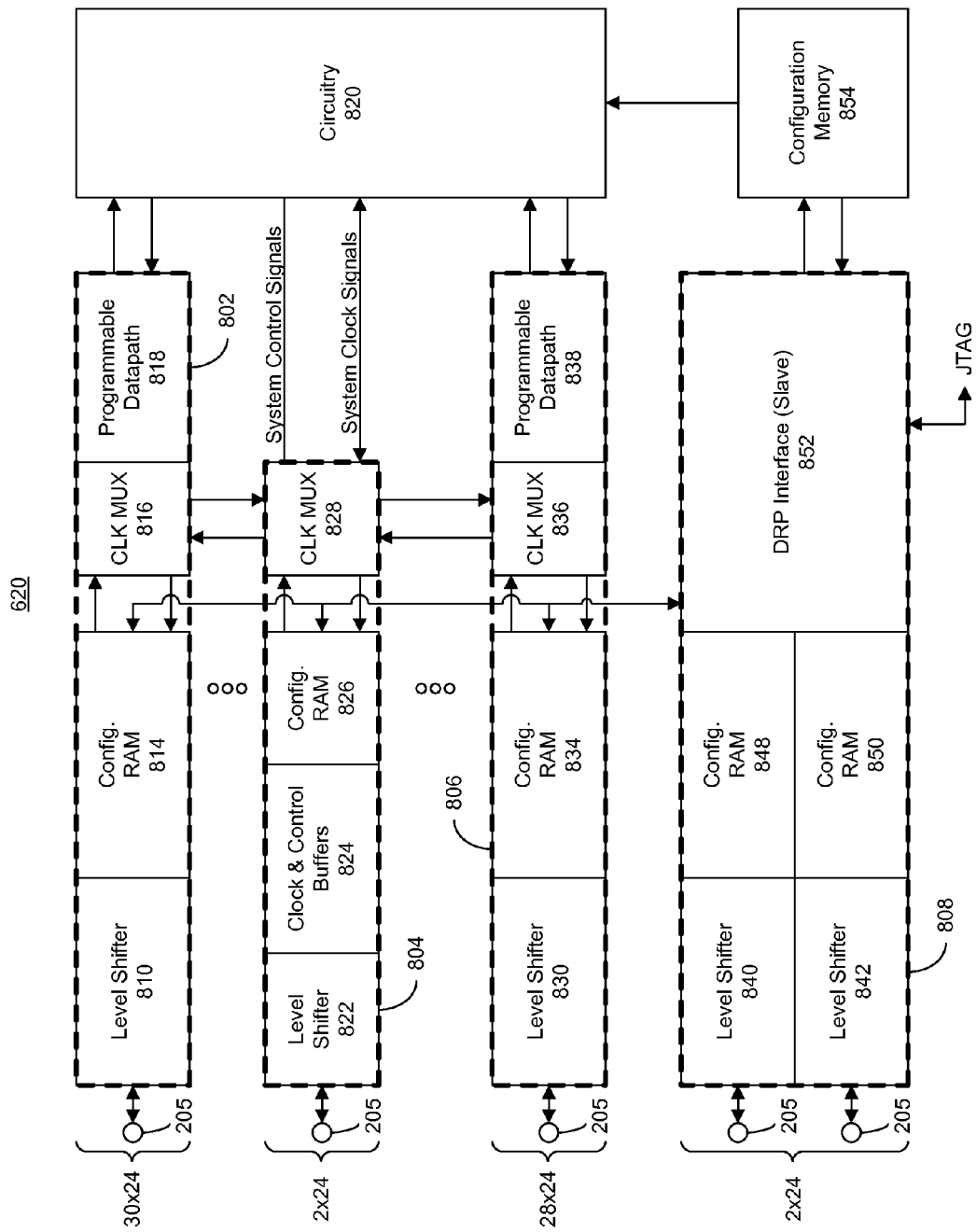
FIG. 8 is an eighth block diagram illustrating an exemplary implementation of an interface of FIG. 6.

FIG. 8 is an eighth block diagram illustrating an exemplary implementation of interface 620 of FIG. 6. As described, interface 620 is implemented within base unit 120 of die 115. For purposes of discussion, base unit 120 is implemented as an HSSIO. Each of interfaces 620-630 can be implemented as described with reference to FIG. 8.

Interface 620, like interface 605, includes three different channels including a data path channel, a control channel, and a DRP. A data path channel available for conveying user data includes blocks 802 and 806. Block 802 can provide 30 sub-channels with each sub-channel including 24 signal wires, e.g., a 24 bit parallel interface. Block 806 can provide 28 sub-channels with each sub-channel including 24 signal wires, e.g., a 24 bit parallel interface. Block 702 of interface 605 couples to block 802 of interface 620 via inter-die wires within the interposer.

Block 802 includes a level shifter 810 and configuration RAM 814. Block 802 further can include a clock multiplexer block 816 and a programmable data path 818. As shown, programmable data path 818 couples to circuitry 820 of base unit 120. Circuitry 820 of base unit 120 represents the functional circuitry implementing the HSSIO functions of base unit 120. Block 806 includes a level shifter 830 and configuration RAM 834. Block 806 further can include a clock multiplexer block 836 and a programmable data path 838. As shown, programmable data path 838 couples to circuitry 820.

The control channel of interface 620 is implemented by block 804. Block 804 can provide 2 sub-channels with each sub-channel including 24 signal wires, e.g., a 24 bit parallel interface. As shown, block 804 includes a level shifter 822, clock and control buffers 824, configuration RAM 826, and a clock multiplexer block 828. The global control signals and global clock signals received from block 704 of interface 605 are converted to system control signals and system clock signals, which are in turn provided to circuitry 820.

The DRP port of interface 620 is implemented by block 808. Block 808 can provide 2 sub-channels with each sub-channel including 24 signal wires, e.g., a 24 bit parallel interface. As shown, block 808 includes level shifters 840 and 842, configuration RAMs 848 and 850, and a DRP interface 852, which is a slave interface. DRP interface 852 can couple to configuration memory 854. DRP interface 852 programs configuration memory 854 according to received configuration data from DRP interface 762 of FIG. 7. Configuration memory 854 controls the functionality of circuitry 820, e.g., places circuitry 820 into one of a plurality of different operation modes.

DRP interface 852, which is a slave interface, is coupled to the configuration RAMs 814, 826, 834, 848, and 850 via a configuration RAM read/write port. When a frame of configuration data is received from die 110, DRP interface 762 can transfer the frame to the appropriate one of configuration RAMs 814, 826, 834, 848, or 850, or to configuration memory 854. For example, responsive to DRP interface 762 of interface 605 sending configuration data, DRP interface 852 can write the configuration data into an appropriate configuration RAM and/or configuration memory 854.

Figure 9:
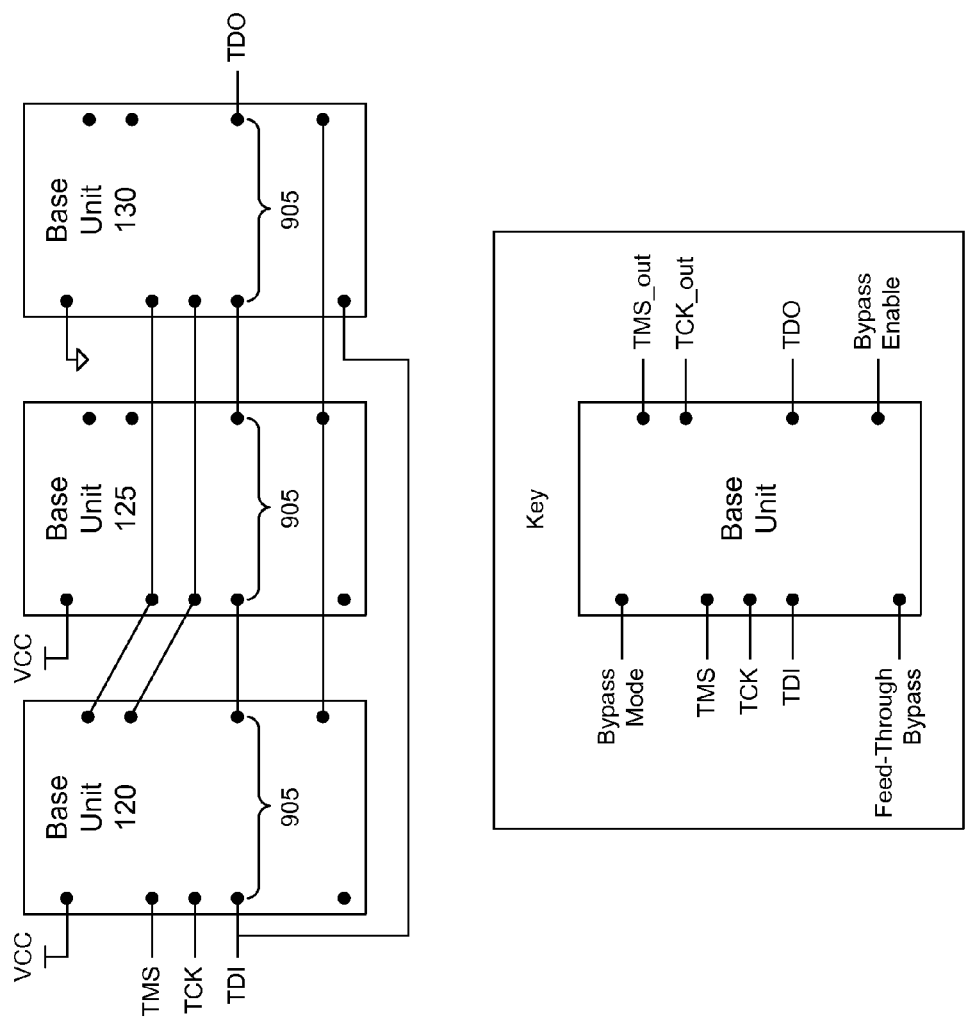
FIG. 9 is a ninth block diagram illustrating Joint Test Action Group (JTAG) connectivity among base units using an interposer.

FIG. 9 is a ninth block diagram illustrating JTAG connectivity among base units using an interposer. Base units 120-130 of FIG. 1 are illustrated. As discussed, base units 120-130 are identical. The key illustrates the pin layout of each respective base unit 120-130. As pictured, each of base units 120-130 includes a JTAG interface implementation that includes a TMS (Test Mode State) pin, a TCK (Test Clock) pin, a TDI (Test Data In) pin, a Bypass Mode pin, a Feed-Through Bypass pin, a TMS_out pin, a TCK_out pin, a TDO (Test Data Out) pin, and a Bypass Enable pin. For example, the various pins illustrated can represent micro bump connections to interposer 105 (not shown).

Each base unit further can include a signal path 905 from the TDI pin to the TDO pin. Signal path 905 can be configured to provide a registered signal path or an unregistered signal path as will be described within this specification in greater detail. Signals that propagate between individual ones of base units 120-130 are conveyed through interposer 105. Referring to base unit 120 and base unit 125, for example, the following signals are implemented within interposer 105: the signal connecting the TMS_out pin of base unit 120 to the TMS pin of base unit 125; the signal connecting the TCK_out pin of base unit 120 to the TCK pin of base unit 125; the signal connecting the TDO pin of base unit 120 with the TDI pin of base unit 125; and the signal connecting the Bypass Enable pin of base unit 120 with the Bypass Enable pin of base unit 125.

Referring to base unit 125 and base unit 130, for example, the following signals are implemented within interposer 105: the signal connecting the TMS pin of base unit 125 to the TMS pin of base unit 130; the signal connecting the TCK pin of base unit 125 to the TCK pin of base unit 130; the signal connecting the TDO pin of base unit 125 with the TDI pin of base unit 130; and the signal connecting the Bypass Enable pin of base unit 125 (and the Bypass Enable pin of base unit 120) with the Bypass Enable pin of base unit 130. Further, the Feed-Through Bypass pin of base unit 130 is coupled to the TDI signal received by base unit 120 (e.g., the last base unit of the die) via interposer 105.

In one aspect, the signal provided to the Bypass Mode pin of each base unit determines an operating mode for the JTAG interface of the base unit. As shown, the Bypass Mode pin of base units 120 and 125 is coupled to a voltage high, e.g., VCC, whereas the Bypass Mode pin of base unit 130 is coupled to ground. Accordingly, the JTAG interfaces of base units 120 and 125 are in a normal operating mode. The JTAG interface of base unit 130 is in a different operating mode referred to as "Feed-Through Bypass." It should be appreciated that the use of a high or a low signal coupled to the Bypass Mode pin of each base unit for invoking a particular operating mode for a JTAG interface is for purposes of illustration and can be reversed if so desired. Further, while shown as static connections, each Bypass Mode pin can be coupled to a signal within interposer 105 that couples to a control unit within another die, e.g., a programmable IC, thereby allowing the other die to control the particular operating mode of the JTAG interface in each base unit and switch the operating mode of the JTAG interface of each base unit in operation (dynamically) for testing purposes as may be required.

In general, Feed-Through Bypass Mode controls whether the JTAG interface of a base unit passes the signal received on the TDI pin of the base unit on the TDO pin of the base unit or passes the signal received on the Feed-Through Bypass pin of the base unit on the TDO pin of the base unit. Thus, in normal operating mode, the signal on the TDI pin is passed to the TDO pin for each of base units 120 and 125. A further setting within each of base units 120 and 125 determines whether the signal path 905 is registered or not. Base unit 130, in implementing the Feed-Through Bypass Mode, passes the signal received at the Feed-Through Bypass pin to the TDO pin instead of the signal on the TDI pin. As shown, the signal provided to the Feed-Through Bypass pin of base unit 130 is the TDI signal taken from the interposer. The signal path from the Feed-Through Bypass pin to the TDO pin of a base unit is an unregistered signal path.

Figure 10:
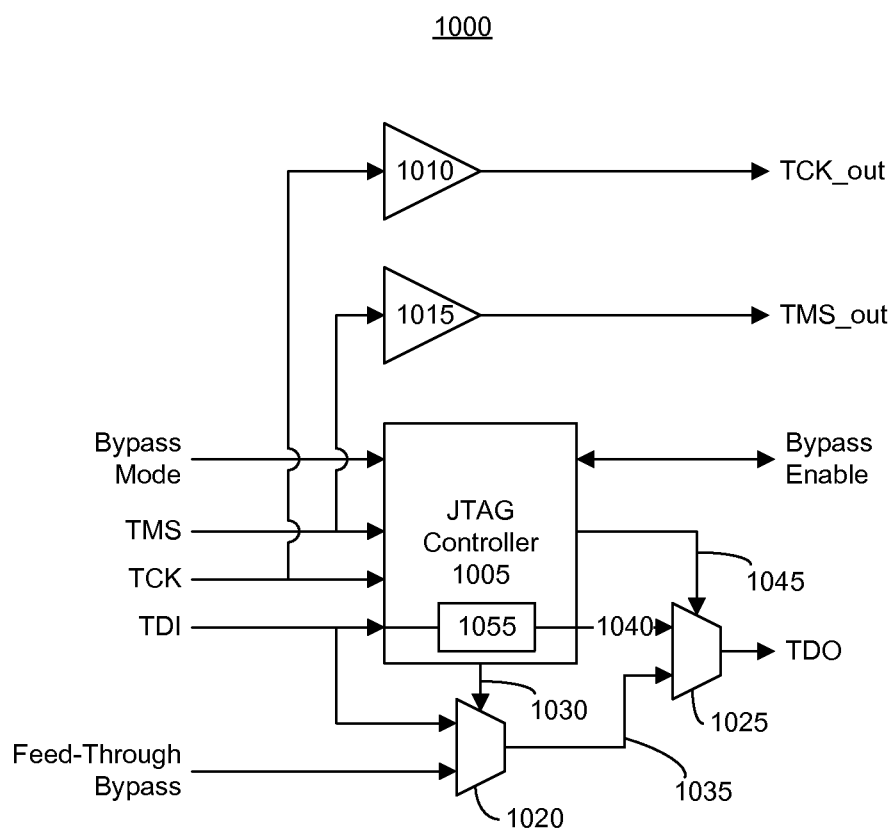
FIG. 10 is a tenth block diagram illustrating a JTAG interface.

The features illustrated in FIG. 9 and to be described in further detail in FIG. 10 allow a multi-die IC to behave, from a JTAG standpoint, as a single device. In electronic systems, when devices are placed in a JTAG Bypass Mode, each is configured to shift out a one value. By counting the number of ones shifted out of a given system, e.g., a circuit board with multiple ICs mounted thereon, one can determine the number of devices.

In the case of a multi-die IC, however, the device must appear to the end user as a single device as opposed to multiple devices (e.g., where each die within the multi-die IC shifts out a one value). The features illustrated in FIG. 9 above and FIG. 10 to follow allow a multi-die IC to behave, from an end user standpoint using JTAG, as a single device in that the entire multi-die IC is configurable to shift out a single one value. Only those TDI-TDO signal paths that are registered, for example, will shift out a one value. Those signal paths not registered exhibit pass through behavior and do not generate a one value that is shifted out. Using the interposer configurations illustrated in FIG. 9, one can control which die or dies generate the one value for the JTAG Bypass Mode and which dies do not. For testing purposes in development of the multi-die IC itself, however, different JTAG modes can be implemented that cause the multi-die IC to appear, from a JTAG point of view, as multiple devices.

FIG. 10 is a tenth block diagram illustrating a JTAG interface 1000. JTAG interface 1000 can be implemented within each base unit, i.e., base units 120-130 as described with reference to FIG. 9 to facilitate the various JTAG operation modes described. In general, the JTAG interface of each base unit can be coupled to the DRP slave interface included therein.

As shown, JTAG interface 1000 includes a JTAG controller 1005, buffers 1010 and 1015, and selector circuits 1020 and 1025. JTAG controller 1005 receives a TMS signal, a TCK signal, a TDI signal, and a Bypass Mode signal. Buffer 1010 also receives the TCK signal and generates a buffered version of the TCK signal as the TCK_out signal, which is provided to the TCK_out pin of the base unit. Buffer 1015 receives the TMS signal and generates a buffered version of the TMS signal as the TMS_out signal, which is provided to the TMS_out pin of the base unit. The ability to buffer the TMS and TCK signals allows the load on such signals to be substantially reduced. Within implementations in which the number of base units (or dies) places a larger than expected load upon the TMS and TCK signals, such buffering can be helpful in that the loading effects are reduced while incurring only a small delay on the TCK and TMS signals.

Appreciably, whether the TMS signals and the TCK signals are buffered or not can be determined according to the connections established by the interposer upon which the base units are disposed. For example, the configuration illustrated in FIG. 9 utilizes buffering of the TMS and TCK signals in base unit 120 since the TMS_out pin and the TCK_out pin are coupled to base unit 125. Base unit 125 and 130, however, do not utilize buffering of the TMS and TCK signals since the TMS and TCK pins of base unit 125 are coupled to the TMS and TCK pins of base unit 130 while bypassing the TMS_out and TCK_out pins of base unit 125.

The Bypass Mode signal (corresponding to the Bypass Mode pin) determines whether the JTAG interface of the base unit is in a normal mode or a Feed-Through Bypass mode. When in Feed-Through Bypass mode, JTAG controller 1005 instructs selector circuit 1020 via control signal 1030 to pass the Feed-Through Bypass signal as signal 1035. When in the normal mode, JTAG controller 1005 instructs selector 1020 via control signal 1030 to pass the TDI signal as signal 1035. Selector circuit 1020 can be implemented as a multiplexer or any other circuit capable of selectively passing one of a plurality of signals responsive to a control signal or generating a particular signal with a desired state responsive to a control signal. In effect, selector circuit 1020 determines whether the TDI signal comes from the standard TDI which is from the cascade of the neighbor base unit TDO or from the Feed-Through Bypass which comes from the first TDI in the cascade chain of base units.

The Bypass Enable signal controls whether selector circuit 1025 passes signal 1040 or signal 1035 as the TDO signal. Signals 1035 and 1040 can be considered intermediate TDO signals since one of signals 1035 or 1040 is passed as TDO. JTAG controller 1005, for example, provides control signal 1045 to selector circuit 1025 according to the state of the Bypass Enable signal. Selector circuit 1025 can be implemented as a multiplexer or any other circuit capable of selectively passing one of a plurality of signals responsive to a control signal or generating a particular signal with a desired state responsive to a control signal. In any case, selector circuit 1025 allows either signal 1035 (either the TDI signal or the Feed-Through Bypass signal) or signal 1040 to be passed as TDO. The signal path through selector circuit 1020 and selector circuit 1025 is an unregistered path, unlike the path from TDI through JTAG controller 1005 and register 1055 which outputs signal 1040. In this manner, selector circuit 1025 determines whether an unregistered signal is passed (the TDI signal or the Feed-Through Bypass signal) or a registered signal (signal 1040) as TDO.

In one aspect, the Bypass Enable signal is implemented as a bi-directional open drain signal which would have a weak pull-up enable in the base unit. Each base unit, regardless of mode, would drive the bypass enable low when a Feed-Through Bypass command is not in a JTAG instruction register of JTAG controller 1005. When the Feed-Through Bypass command or a High-Z command is in the JTAG instruction register, or after a Test-Logic-Reset state, the Bypass Enable signal can be tri-stated. Accordingly, if all base units are in the Feed-Through Bypass mode, the Bypass Enable signal will be high. Each base unit, regardless of mode, would pass signal 1035 as the TDO signal when the Feed-Through Bypass command or a High-Z command is in the JTAG instruction register, or after a Test-Logic-Reset state. The JTAG interface, when in the Feed-Through Bypass mode, passes the Feed-Through Bypass as signal 1035 on as the TDO signal when the Feed-Through Bypass instruction or High-Z instruction is in the JTAG instruction register. The JTAG interface, when in the Feed-Through Bypass mode, also passes the Feed-Through Bypass signal as the TDO signal after the Test-Logic-Reset state and the Feed-Through Bypass instruction, or the High-Z instruction, is in the JTAG instruction register. The JTAG interface, when in the Feed-Through Bypass mode, also passes the Feed-Through Bypass signal as the TDO signal after the Test-Logic-Reset state and the Bypass Enable signal is high. If the Bypass Enable signal is low, JTAG controller 1005 connects the TDI pin to the TDO pin, using register 1055, using signal 1035, or using signal 1040 as determined by the Feed-Through mode. This bypass will significantly reduce the feed-through delay when implementing a die using multiple base units as described.

A JTAG interface as described with reference to FIG. 10 can be added to any other die, e.g., die 110, to further reduce the feed-through delay. Accordingly, based upon the mode of the JTAG interface in each die and/or base unit as the case may be, the multi-die IC can be configured to generate a single device identifier or pass a single one value. For purposes of testing the multi-die IC itself, the JTAG interface can be placed in an operation mode in which each individual die and/or base unit is able to respond with a device identifier and/or passing a one value. Any combination of operating modes for JTAG interfaces can be implemented based upon providing signal values to the JTAG controller in each die and/or base unit to effectuate the desired operating mode for that JTAG interface on a per die and/or per base unit basis.

In accordance with the inventive arrangements disclosed within this specification, each base unit further can be designed to include fully self-contained Built-In Self Test (BIST) structures. Each base unit also can include a standard low pin count interface of approximately 50 probe pins plus power(s) and GND(s). The small size of each base unit facilitates multi-site testing. During wafer sort, multi-site testing allows the testing of many dies at the same time. In one aspect, higher yielding wafers can be used to make the dies with the largest number of base units since multiple consecutive base units are required for a good die. Lower yielding wafers can be used to create dies with lower numbers, e.g., fewer, base units, since fewer consecutive good base units are required.

An exemplary operational scenario is described with reference to FIGS. 9 and 10 in combination. An interposer has three identical base units configured as illustrated in FIG. 9 and described within this specification. Each base unit includes a JTAG controller as described with reference to FIG. 10. Base units 120 and 125 are operating in a normal mode. Base unit 130 is operating in a Feed-Through Bypass mode. A fourth standard, e.g., conventional, JTAG controller without the additional features described with reference to FIG. 10, can be included within another die, e.g., an FPGA, also mounted on the interposer. The fourth JTAG controller has its TDI pin connected to the TDO pin of base unit 130.

By clocking the TCK pin common to all base units seven times with the common TMS pin set high, all of the JTAG controllers are placed in the Test-Logic-Reset state. All JTAG controllers will be in Feed-Through Bypass mode thereby tri-stating the Bypass-Enable pins and making the Bypass-Enable signal high within the interposer.

The JTAG controllers again can be clocked using the TMS and TCK pins to place the JTAG controllers in the Shift-DR state. The JTAG controllers operating in the normal mode connect the TDI pin to the TDO pin using a non-registered path. The JTAG controller operating in the Feed-Through Bypass mode connects the Feed-Through Bypass pin to the TDO pin using a non-registered path. The fourth JTAG controller operates in the normal bypass mode and has a signal register delay between the TDI pin and the TDO pin.

The JTAG controllers then can be clocked using the TMS and TCK pins to load the instruction registers of the JTAG controllers within base units 120, 125, 130, and the fourth JTAG controller with the instructions "Feed-Through Bypass," "Feed-Through Bypass," "Feed-Through Bypass," and "extest," respectively.

The JTAG controllers again can be clocked using the TMS and TCK pins to implement the Shift-DR state. The JTAG controllers operating in the normal mode connect the TDI pin to the TDO pin using a non-registered path. The JTAG controller operating in the Bypass Enable mode connects the Feed-Through Bypass pin to the TDO pin using a non-registered path. The fourth JTAG controller connects the I/O boundary scan register of the JTAG controller between the TDI pin and the TDO pin of that unit. The result is a device (in reference to the multi-die IC) with only the boundary scan register of the fourth unit being in place between the TDI and TDO pins of the device with minimum delay incurred in the three-base units in feed-through bypass.

The JTAG controllers again can be clocked using the TMS and TCK pins to load the instruction register of the JTAG controller of each of base units 120, 125, and 130 and the fourth JTAG controller with the instruction "High-Z."

The JTAG controllers again can be clocked using the TMS and TCK pins to implement the Shift-DR state. The base unit JTAG controllers operating in the normal mode connect the TDI to the TDO pin using a non-registered path. The JTAG controller operating in the Bypass-Enable mode connects the Feed-Through Bypass pin to the TDO pin using a non-registered path. The fourth JTAG controller connects a single bypass register between the TDI pin and the TDO pin of that unit. All of the JTAG controllers tri-state I/O as required by the High-Z command. The result is a device (in reference to the multi-die IC) with a single register between the TDI and TDO pins with minimum delay incurred in the three-base units in feed-through bypass mode.

FIG. 11 is a table illustrating operational states of the JTAG interface of FIG. 10. The "Bypass Signal Mode" column indicates the state of the Bypass Signal. The "Instruction Register" column indicates the particular JTAG instruction in the instruction register within the JTAG controller. The "Feed-Through Bypass Signal" column indicates whether the Feed-Through Bypass signal is used for the mode defined by the row of table 11, wherein "Bypass-Input" indicates that the signal is or may be used. The "Bypass-Enable Signal" column indicates the state of the Bypass-Enable signal of the JTAG interface. The "Signal Passed as TDO" indicates which of the signal paths is active and used to generate and/or convey the TDO signal output from the JTAG interface given the state of the other elements for the JTAG interface in the row. The particular signal that is output as the TDO signal can be either the TDI signal that is passed as signal 1035 and then output as TDO (unregistered); the TDI signal registered within the JTAG controller and passed as signal 1040 and output as TDO (registered); or the Feed-Through Bypass signal passed as signal 1035 and then output as TDO (unregistered).

The examples disclosed within this specification provide techniques for developing various multi-die IC products while reducing the number of mask sets required. Interposer technology is leveraged to communicatively link base units of a die with other dies. As discussed, the base units are identical and have no means of communication with one another by way of the die in which each base unit is implemented. Interposer technology allows dies to be coupled together with signal densities in the thousands as opposed to the limitations of packaging technologies that permit coupling of dies with only tens of signals.

For purposes of explanation, specific nomenclature is set forth to provide a thorough understanding of the various inventive concepts disclosed herein. The terminology used herein, however, is for the purpose of describing particular embodiments only and is not intended to be limiting. For example, reference throughout this specification to "one embodiment," "an embodiment," or similar language means that a particular feature, structure, or characteristic described in connection with the embodiment is included in at least one embodiment disclosed within this specification. Thus, appearances of the phrases "in one embodiment," "in an embodiment," and similar language throughout this specification may, but do not necessarily, all refer to the same embodiment.

The terms "a" and "an," as used herein, are defined as one or more than one. The term "plurality," as used herein, is defined as two or more than two. The term "another," as used herein, is defined as at least a second or more. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

The term "and/or" as used herein refers to and encompasses any and all possible combinations of one or more of the associated listed items. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof. It will also be understood that, although the terms first, second, etc. may be used herein to describe various elements, these elements should not be limited by these terms, as these terms are only used to distinguish one element from another.

The term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The corresponding structures, materials, acts, and equivalents of all means or step plus function elements in the claims below are intended to include any structure, material, or act for performing the function in combination with other claimed elements as specifically claimed. Within the figures, the various elements and/or blocks shown are not drawn to scale. As such, one or more of the blocks and/or elements may vary in size from the examples shown.

The invention disclosed within this specification can be embodied in other forms without departing from the spirit or essential attributes thereof. Accordingly, reference should be made to the following claims, rather than to the foregoing specification, as indicating the scope of the invention.

What is claimed is:

1. An integrated circuit structure, comprising:
a first die;
a second die comprising a first base unit and a second base unit;
wherein each of the first base unit and the second base unit is self-contained and no signals pass between the first base unit and the second base unit within the second die; and
an interposer comprising a first plurality of inter-die wires coupling the first die to the first base unit, a second plurality of inter-die wires coupling the first die to the second base unit, and a third plurality of inter-die wires coupling the first base unit to the second base unit.

2. The integrated circuit structure of claim 1, wherein the first base unit and the second base unit are separated by a scribe area that includes no circuit elements.

3. The integrated circuit structure of claim 1, wherein the first base unit and the second base unit are identical.

4. The integrated circuit structure of claim 1, wherein:
the first die comprises a first Joint Test Action Group (JTAG) interface;
the first base unit comprises a second JTAG interface; and
the second base unit comprises a third JTAG interface.

5. The integrated circuit structure of claim 4, wherein the second JTAG interface provides a first operation mode in which a Test Data In signal of the second JTAG interface is registered and a second operation mode in which the Test Data In signal of the second JTAG interface is not registered.

6. The integrated circuit structure of claim 5, wherein the third JTAG interface provides a first operation mode in which a Test Data In signal of the third JTAG interface is registered and a second operation mode in which the Test Data In signal of the third JTAG interface is not registered.

7. The integrated circuit structure of claim 4, wherein the second JTAG interface comprises:
a buffer configured to receive a JTAG signal and generate a buffered version of the JTAG signal as an output.

8. The integrated circuit structure of claim 4, wherein the interposer comprises:
an inter-die wire coupling a Test Data In pin of the first base unit with a Feed-Through Bypass pin of the second base unit;
wherein the inter-die wire forms an unregistered signal path between the first base unit and the second base unit.

9. The integrated circuit structure of claim 8, wherein the third JTAG interface comprises:
a Test Data In pin coupled to a Test Data Out pin of the second JTAG interface via an inter-die wire of the interposer;
a register coupled to the Test Data In pin and configured to generate a registered version of a signal received on the Test Data In pin as a first intermediate Test Data Out signal for the third JTAG interface; and
a selector circuit configured to pass the first intermediate Test Data Out signal or a second intermediate Test Data Out signal that is unregistered to a Test Data Out pin of the second base unit according to an operational mode of the third JTAG interface.

10. The integrated circuit structure of claim 1, wherein each base unit comprises a Joint Test Action Group (JTAG) interface comprising:
a JTAG controller configured to receive a Test Data In signal and generate a registered version of the Test Data In signal as a first intermediate Test Data Out signal;
a first selector configured to pass a Feed-Through Bypass signal or the Test Data In signal as a second intermediate Test Data Out signal under control of the JTAG controller; and
a second selector configured to pass the first intermediate Test Data Out signal or the second intermediate Test Data Out signal under control of the JTAG controller.

11. The integrated circuit structure of claim 1, wherein:
the first base unit comprises a dynamic configuration port coupled to the first die via the second plurality of inter-die wires; and
the second base unit comprises a dynamic configuration port coupled to the second die via the third plurality of inter-die wires.

12. The integrated circuit structure of claim 11, wherein:
the first base unit is configurable to implement one of a plurality of operation modes; and
the second base unit is configurable to implement one of the plurality of operation modes independently of the operation mode of the first base unit.

13. A Joint Test Action Group (JTAG) interface for an integrated circuit, the JTAG interface comprising:
a JTAG controller configured to receive a Test Data In signal and generate a registered version of the Test Data In signal as a registered intermediate Test Data Out signal;
a first selector configured to pass a Feed-Through Bypass signal or an unregistered version of the Test Data In signal as an unregistered intermediate Test Data Out signal under control of the JTAG controller; and
a second selector configured to pass the registered intermediate Test Data Out signal or the unregistered intermediate Test Data Out signal under control of the JTAG controller.

14. The JTAG interface of claim 13, further comprising:
a first buffer configured to receive a Test Mode State signal and generate a buffered version of the Test Mode State signal as a Test Mode State output signal.

15. The JTAG interface of claim 14, further comprising:
a second buffer configured to receive a Test Clock signal and generate a buffered version of the Test Clock signal as a Test Clock output signal.

16. An integrated circuit die, comprising:
a first base unit; and
a second base unit;
wherein each of the first base unit and the second base unit is self-contained, separated by a scribe area, and no signals pass between the first base unit and the second base unit within the integrated circuit die.

17. The integrated circuit die of claim 16, wherein:
the first base unit comprises a first Joint Test Action Group (JTAG) interface; and
the second base unit comprises a second JTAG interface.

18. The integrated circuit die of claim 17, wherein the integrated circuit die is mounted on an interposer comprising a plurality of inter-die wires that couple the first JTAG interface with the second JTAG interface.

19. The integrated circuit die of claim 16, wherein each JTAG interface comprises:
a JTAG controller configured to receive a Test Data In signal and generate a registered version of the Test Data In signal as a first intermediate Test Data Out signal;
a first selector configured to pass a Feed-Through Bypass signal or the Test Data In signal as a second intermediate Test Data Out signal under control of the JTAG controller; and
a second selector configured to pass the first intermediate Test Data Out signal or the second intermediate Test Data Out signal under control of the JTAG controller.

20. The integrated circuit die of claim 16, wherein each JTAG interface comprises:
a buffer configured to receive a JTAG signal and generate a buffered version of the JTAG signal as a JTAG output signal.

* * * * *